United States Patent [19]
Cismas

[11] Patent Number: 6,145,073
[45] Date of Patent: Nov. 7, 2000

[54] DATA FLOW INTEGRATED CIRCUIT ARCHITECTURE

[75] Inventor: Sorin C. Cismas, Saratoga, Calif.

[73] Assignee: Quintessence Architectures, Inc., Santa Clara, Calif.

[21] Appl. No.: 09/174,439

[22] Filed: Oct. 16, 1998

[51] Int. Cl.$^7$ .................................................. G06F 13/00
[52] U.S. Cl. ............................................. 712/25; 712/34
[58] Field of Search ............................... 712/25, 34, 33, 712/29, 27, 26, 200, 1; 709/400

[56] References Cited

U.S. PATENT DOCUMENTS

| | | | |
|---|---|---|---|
| 3,845,710 | 11/1974 | Brodrueck | 101/93.14 |
| 4,814,978 | 3/1989 | Dennis | 712/201 |
| 5,555,386 | 9/1996 | Nomura | 712/201 |
| 5,612,640 | 3/1997 | Murabayashi et al. | 327/141 |
| 5,699,460 | 12/1997 | Kopet et al. | 382/307 |
| 5,715,274 | 2/1998 | Rostoker | 375/130 |

OTHER PUBLICATIONS

Terada et al., "VLSI Design of a One–Chip Data–Driven Processor: Q–v1," p. 423–440 in *Data Flow Computing, Theory and Practice*, Ed. Sharp, Ablex Publishing, Norwood, New Jersey, 1992.

Gupta et al., "Introducing Core–Based System Design," *IEEE Design & Test of Computers*, p. 14–25, Oct.–Dec. 1997.

Earnshaw et al., "Challenges in Cross–Development," *IEEE Micro*, p. 28–36, Jul./Aug. 1997.

Madisetti et al., "Interface Design for Core–Based Systems," *IEEE Design & Test of Computers*, p. 42–51, Oct.–Dec. 1997.

Rincon et al., "Core Design and System–on–a–Chip Integration," *IEEE Design & Test of Computers*, p. 26–35, Oct.–Dec. 1997.

*Primary Examiner*—Eric Coleman
*Attorney, Agent, or Firm*—Andrei D. Popovici

[57] ABSTRACT

Pre-designed and verified data-driven hardware cores (intellectual property, functional blocks) are assembled to generate large systems on a single chip. Token transfer between cores is achieved upon synchronous assertion, over dedicated connections, of a one-bit ready signal by the transmitter and a one-bit request signal by the receiver. The ready-request signal handshake is necessary and sufficient for token transfer. There are no combinational paths through the cores, and no latches or master controller are used. The architecture and interface allow a significant simplification in the design and verification of large systems integrated on a single chip.

33 Claims, 9 Drawing Sheets

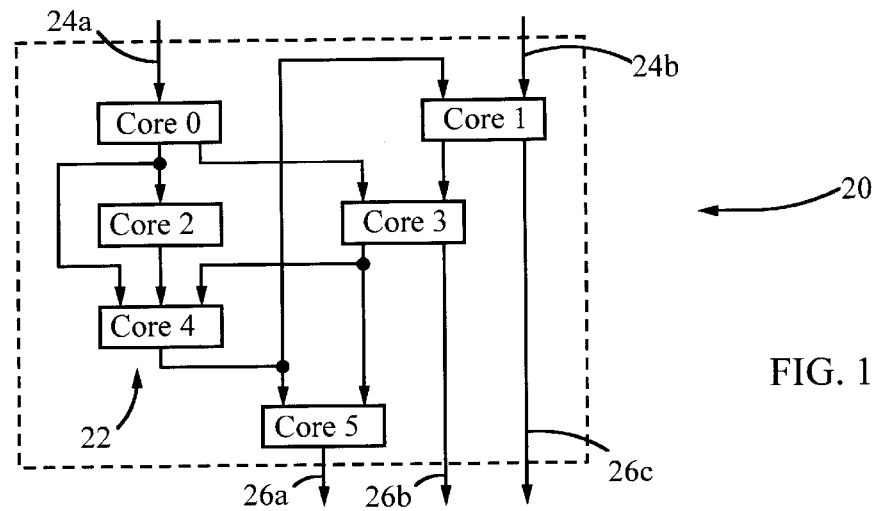
FIG. 1
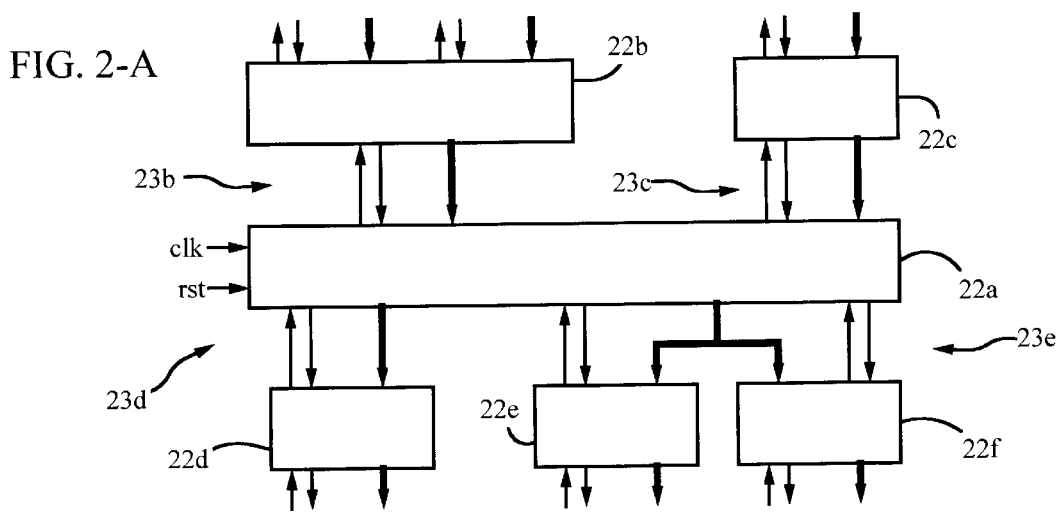
FIG. 2-A
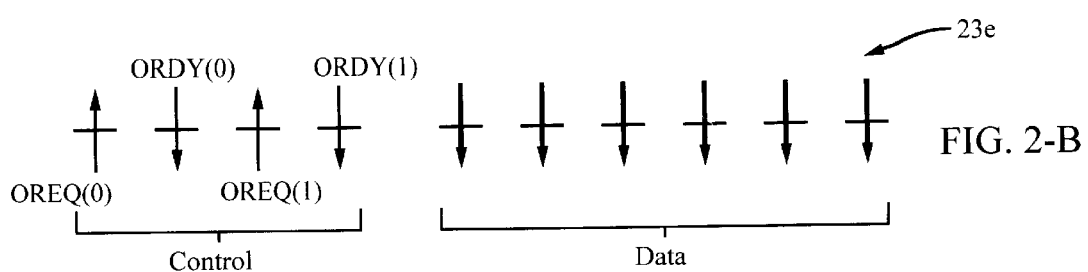
FIG. 2-B

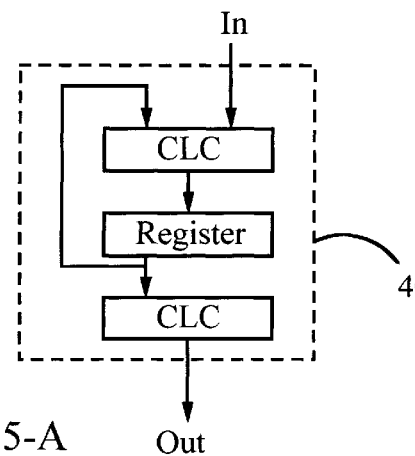
FIG. 5-A
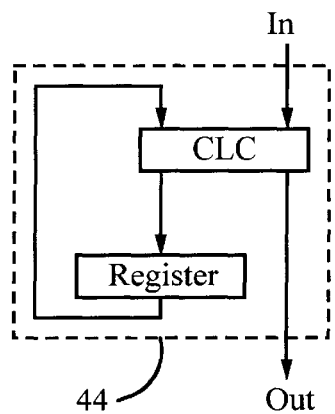
FIG. 5-B
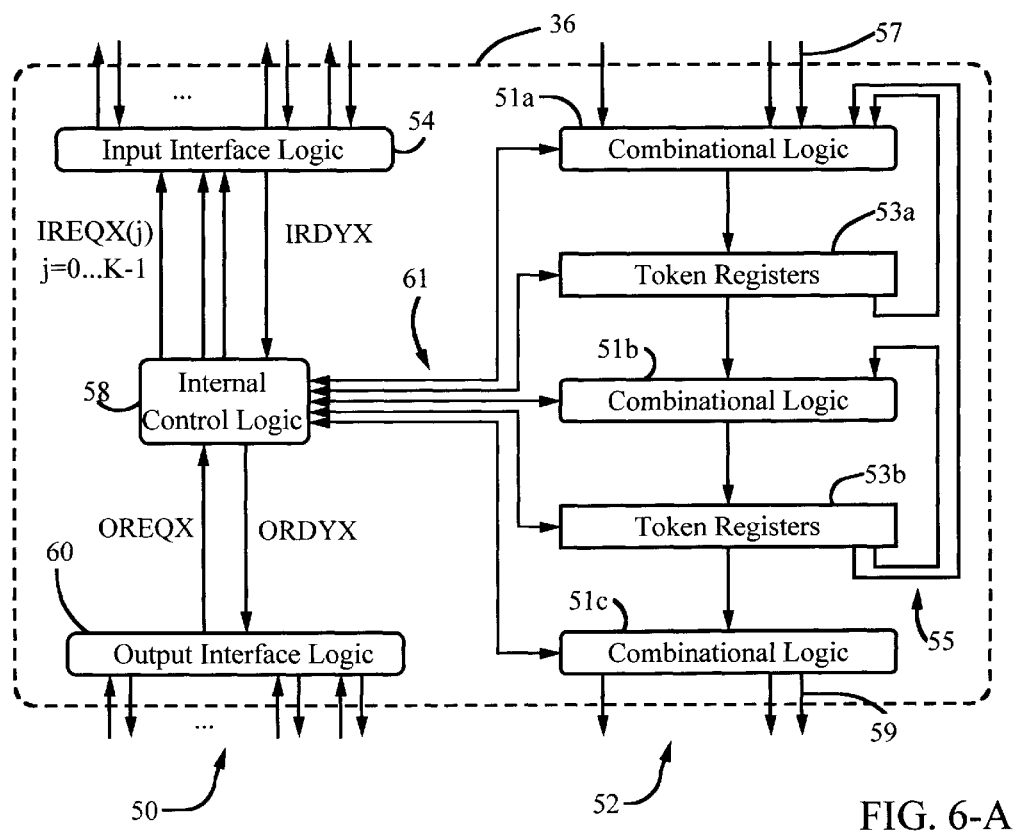
FIG. 6-A

FIG. 6-B
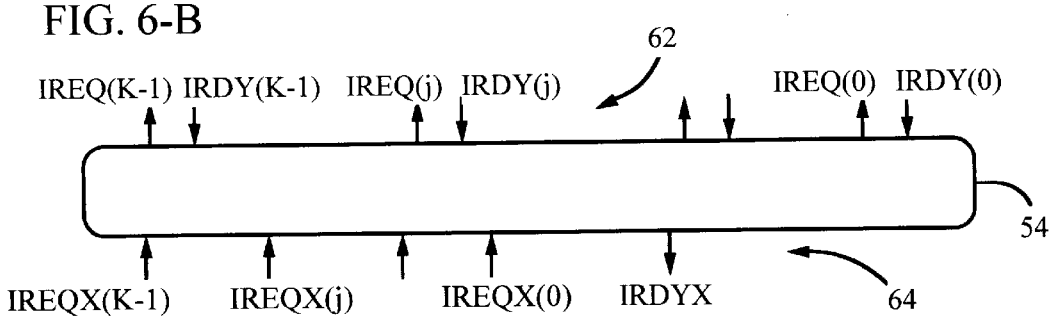
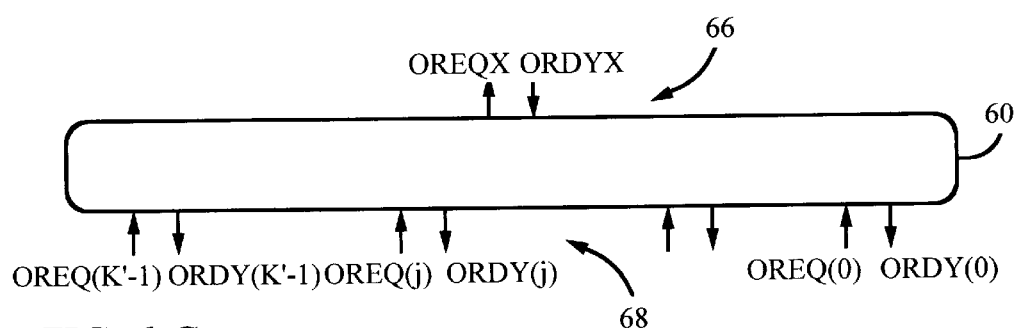
FIG. 6-C
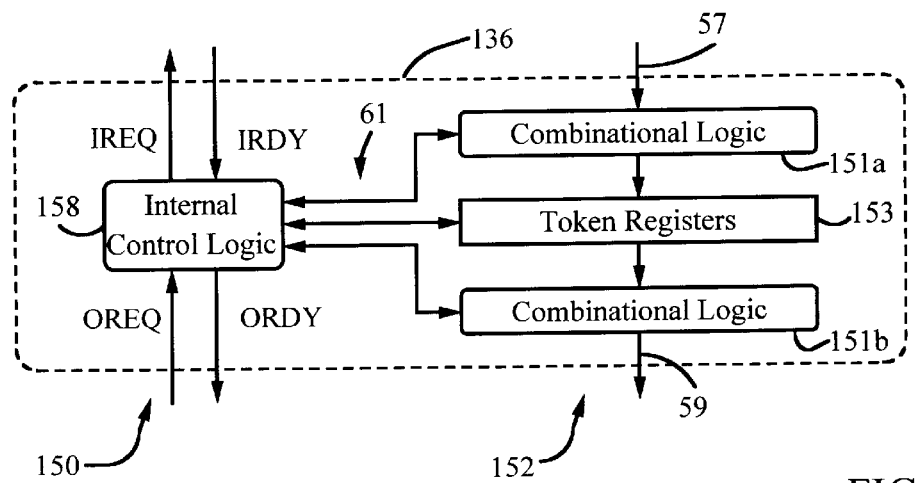
FIG. 7

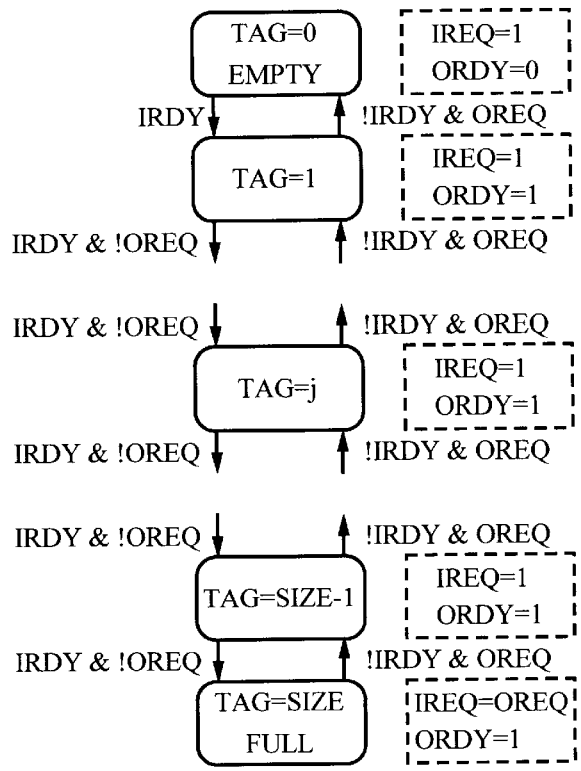
FIG. 8-A
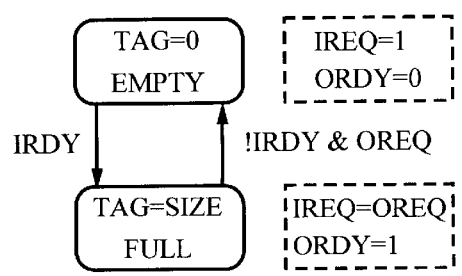
FIG. 8-B

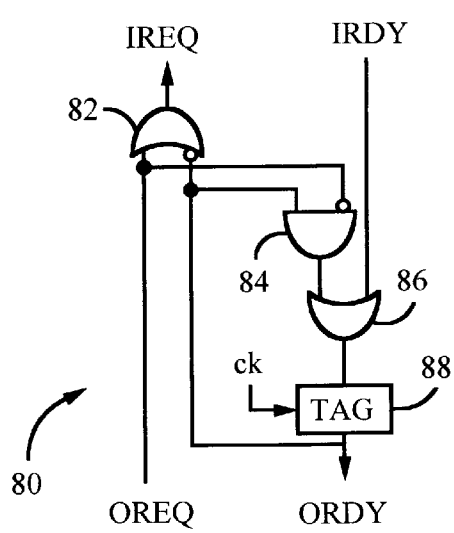
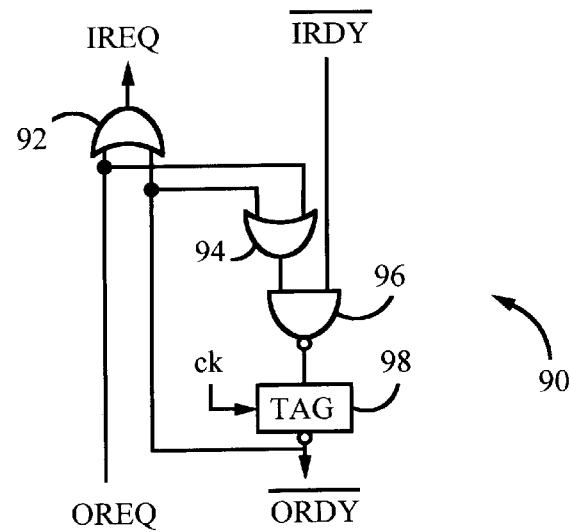
FIG. 9-A    FIG. 9-B
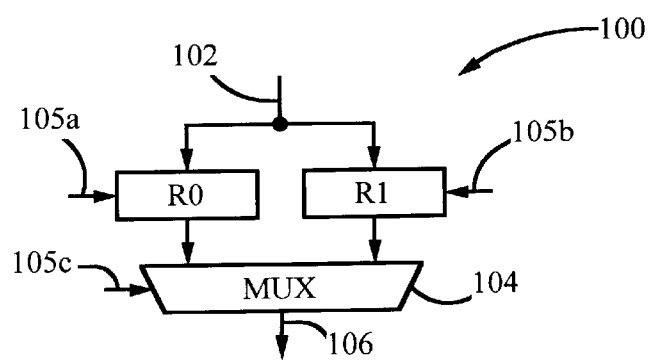
FIG. 10

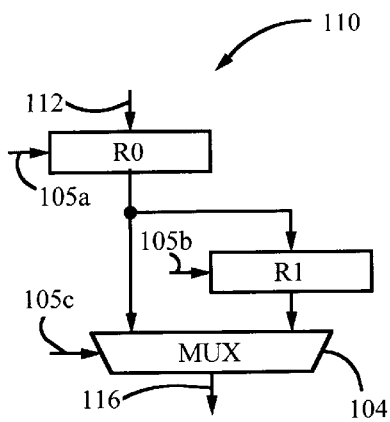
FIG. 11-A
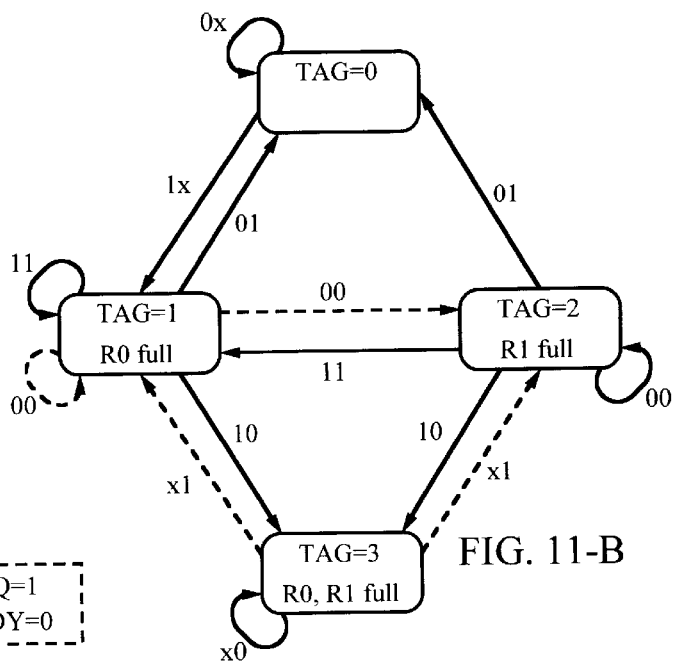
FIG. 11-B
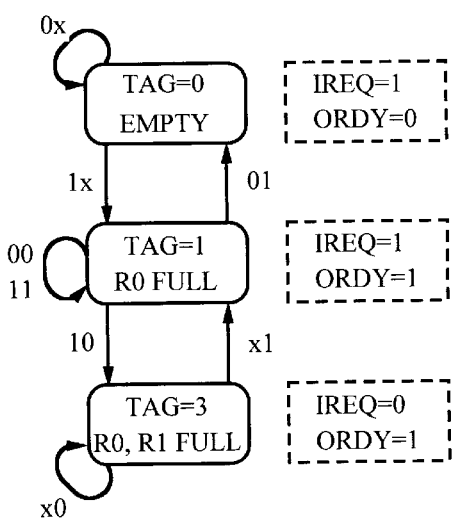
FIG. 11-C

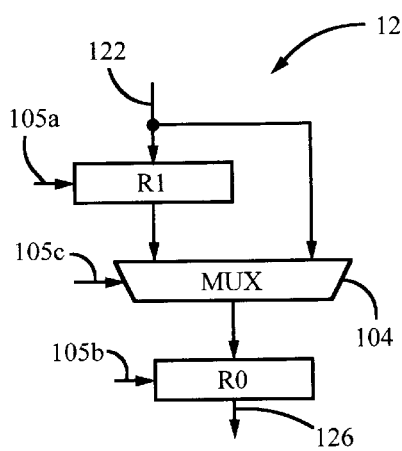
FIG. 12-A
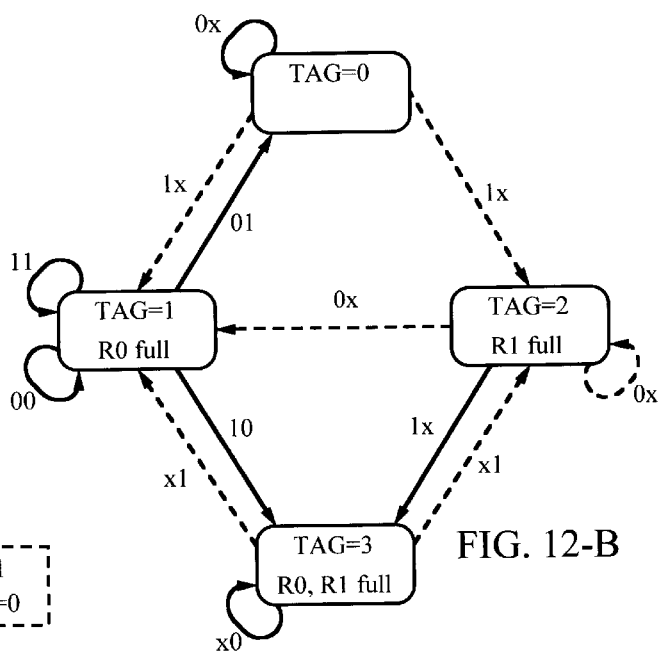
FIG. 12-B
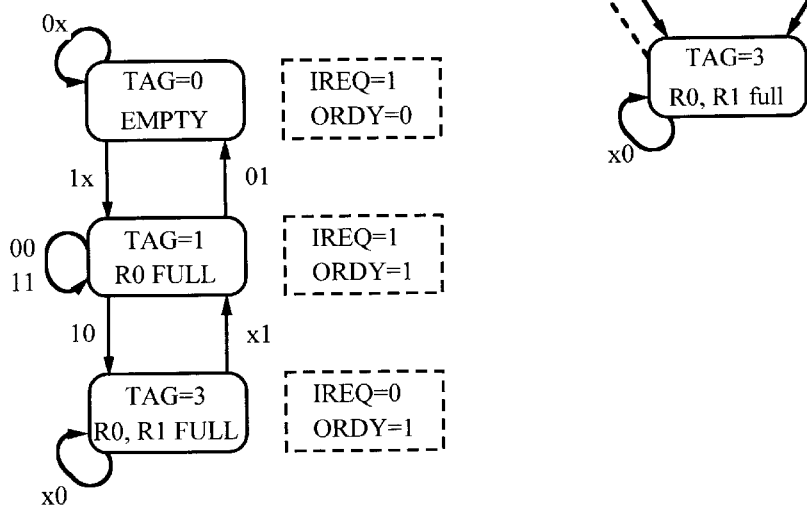
FIG. 12-C

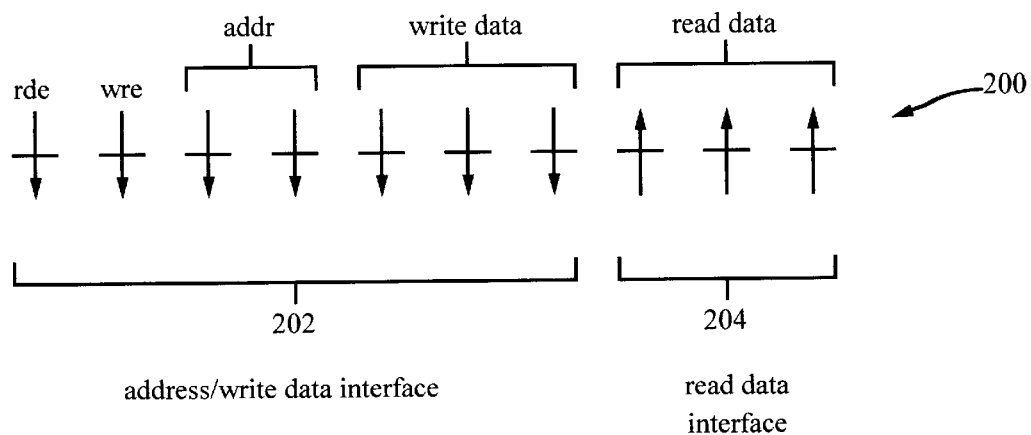
FIG. 13-A
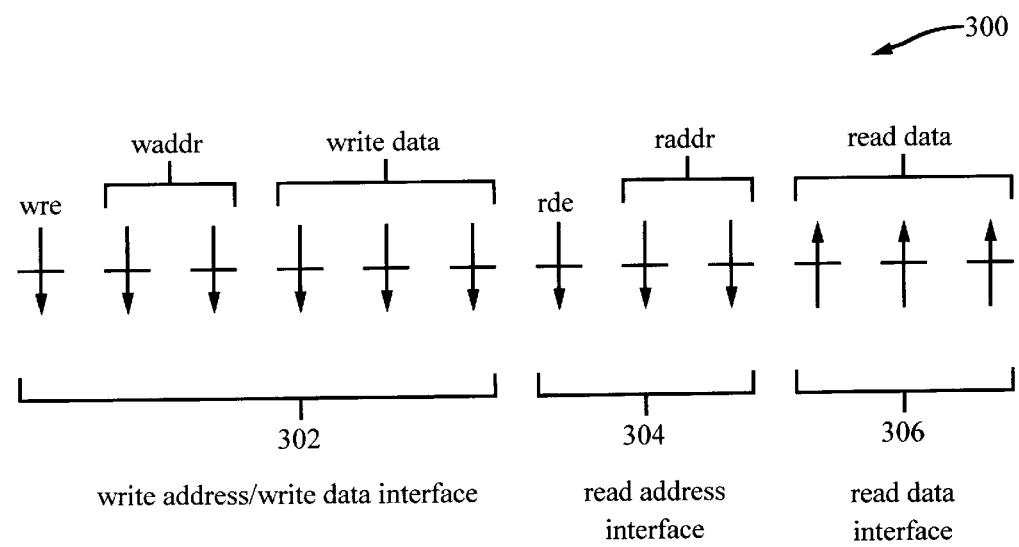
FIG. 13-B

DATA FLOW INTEGRATED CIRCUIT ARCHITECTURE

BACKGROUND

This invention relates to integrated circuits (ICs) and data processing systems and their design, in particular to integrated circuit devices having a modular data-flow (data-driven) architecture.

Continuing advances in semiconductor technology have made possible the integration of increasingly complex functionality on a single chip. Single large chips are now capable of performing the functions of entire multi-chip systems of a few years ago. While providing new opportunities, multi-million-gate systems-on-chip pose new challenges to the system designer. In particular, conventional design and verification methodologies are often unacceptably time-consuming for large systems-on-chip.

Hardware design reuse has been proposed as an approach to addressing the challenges of designing large systems. In this approach, functional blocks (also referred to as cores or intellectual property, IP) are pre-designed and tested for reuse in multiple systems. The system designer then integrates multiple such functional blocks to generate a desired system. The cores are often connected to a common bus, and are controlled by a central microcontroller or CPU.

The hardware design reuse approach reduces the redundant re-designing of commonly-used cores for multiple applications. At the same time, the task of interconnecting the cores often makes the system integration relatively difficult. Such integration is particularly difficult for cores having complex and/or core-specific interfaces. Core integration is one of the major challenges in designing large systems integrated on a single chip using the hardware design reuse approach.

SUMMARY

It is a primary object of the present invention to provide an integrated circuit architecture and interface allowing relatively simple design, simulation, and verification of large systems integrated on a chip. The present invention provides a data processing system having a plurality of data-driven cores integrated on a single chip, and interconnected through standard synchronous, fully-handshaked, dedicated interfaces. To enable high-speed simulation and high clock frequencies on a large chip, all interfaces are registerd and use only unidirectional dedicated connections. There are no combinational paths through a core. The operation of the cores is driven by the flow of data therethrough. No central system controller is needed for controlling the data transfer between the cores. The system can be designed by interconnecting pre-designed, pre-verified cores through the standard interfaces.

Each input interface of a core comprises an input request connection for asserting input request signals to another core, an input ready connection for receiving input ready signals from the other core, and an input data connection for receiving input tokens from the other core. Data processing logic connected to the input data connection generates output tokens from the received input tokens. Each output interface of a core comprises an output request connection for receiving output request signals from another core, an output ready connection for asserting output ready signals to the other core, and an output data connection connected to the data processing logic, for transmitting output tokens to the other core.

Each core further comprises control logic connected to its interfaces and to the data processing logic. The control logic includes input control logic connected to the input interface for controlling the core to receive an input token if an input request signal and a corresponding input ready signal are asserted with a predetermined synchronous relationship, preferably synchronously. The control logic further comprises output control logic connected to the output interface, for controlling the core to transmit an output token if an output request signal and a corresponding output ready signal are asserted with a predetermined synchronous relationship, preferably synchronously. Preferably, the token transfer over the input and output interfaces is effected syrchronously with the assertion of the ready and request signals. The token transfer may also be effected a predetermined number of clock cycles before or after the requisite ready/request handshake.

Each core comprises a plurality of interconnected pipestages, including interface pipestages and internal pipestages. Each of the pipestages has a data path and a control path. The data path receives input tokens from external pipestages over input data connections, and sends output tokens to external pipestages over output data connections. The data path comprises a set of token (data) register levels arranged sequentially in the data path, and optional data processing logic arranged in the data path. The token registers store internal data (tokens) derived from the input tokens. Token transfer through cores is achieved by controlling the loading and transmission of tokens by the token registers. Latches are not used for data transfer control, in order to allow simple simulation and verification of the cores. The data processing logic processes the input tokens and/or the internal tokens to generate the output tokens.

The control path sends and receives control signals to/from the external pipestages corresponding to the input and output data connections, and controls the operation of the data path. The control path includes at least one control register and control logic. The control logic is connected to the control register, to the external pipestages, and to the token registers and data processing logic of the data path. The control register holds a control tag indicative of the storage and transmission capabilities of the data path. The control tag indicates whether the pipestage is capable of accepting input tokens and sending output tokens. The control logic receives the control tag from the control register.

The control logic has at least one pair of external input ready and request connections to external pipestages, and at least one pair of external output ready and request connections to external pipestages. The control logic receives input ready signals over each of the input ready connections, and output request signals over each of the output request connections. The control logic asserts input request signals over each of the input request connections, and output ready signals over each of the output ready connections. A given input request signal is asserted only if the control tag indicates that the data path is capable of receiving a corresponding input token. Similarly, a given output ready signal is asserted only if the control tag indicates that the data path is capable of transmitting the corresponding output token. The control logic updates the control tag whenever the data path receives or transmits a token.

DESCRIPTION OF THE FIGURES

FIG. 1 is a diagram of an exemplary integrated circuit system comprising a plurality of interconnected cores, according to the preferred embodiment of the present invention.

FIG. 2-A shows a core having multiple input interfaces and multiple output interfaces, including a broadcast interface, according to the present invention.

FIG. 2-B illustrates schematically the broadcast interface shown in FIG. 2-A.

FIG. 5-A illustrates schematically a Moore finite state machine.

FIG. 5-B illustrates schematically a Mealy finite state machine.

FIG. 6-A shows a pipestage having multiple inputs, multiple outputs, and multiple token register and data processing logic levels, according to the present invention.

FIG. 6-B illustrates a preferred input control interface for the pipestage of FIG. 6-A.

FIG. 6-C illustrates a preferred output control interface for the pipestage of FIG. 6-A.

FIG. 7 shows a pipestage with a single input, a single output, and a single token register level, according to the present invention.

FIG. 8-A shows a preferred state diagram for a core control circuit of the present invention.

FIG. 8-B shows a state diagram for a core control circuit having a one-bit tag, according to the present invention.

FIG. 9-A is a gate-level illustration of a potential implementation for the core control circuit illustrated in FIG. 8-B, according to the present invention.

FIG. 9-B is a gate-level illustration of another potential implementation for the core control circuit illustrated in FIG. 8-B, according to the present invention.

FIG. 10 shows a register arrangement suitable for use at the input or output of a core, according to the present invention.

FIG. 11-A shows a preferred register arrangement for use in a core input pipestage, according to the present invention.

FIG. 11-B is a state diagram illustrating potential state transitions for the register arrangement of FIG. 11-A.

FIG. 11-C is a state diagram showing the preferred state transitions for the register arrangement of FIG. 11-A.

FIG. 12-A shows a preferred register arrangement for use in a core output pipestage, according to the present invention.

FIG. 12-B is a state diagram illustrating potential state transitions for the register arrangement of FIG. 12-A.

FIG. 12-C is a state diagram showing the preferred state transitions for the register arrangement of FIG. 12-A.

FIG. 13-A illustrates an interface suitable for connecting to a single-port synchronous random access memory (RAM), according to the present invention.

FIG. 13-B illustrates an interface suitable for connecting to a dual-port synchronous RAM, according to the present invention.

DETAILED DESCRIPTION

Figure 3:
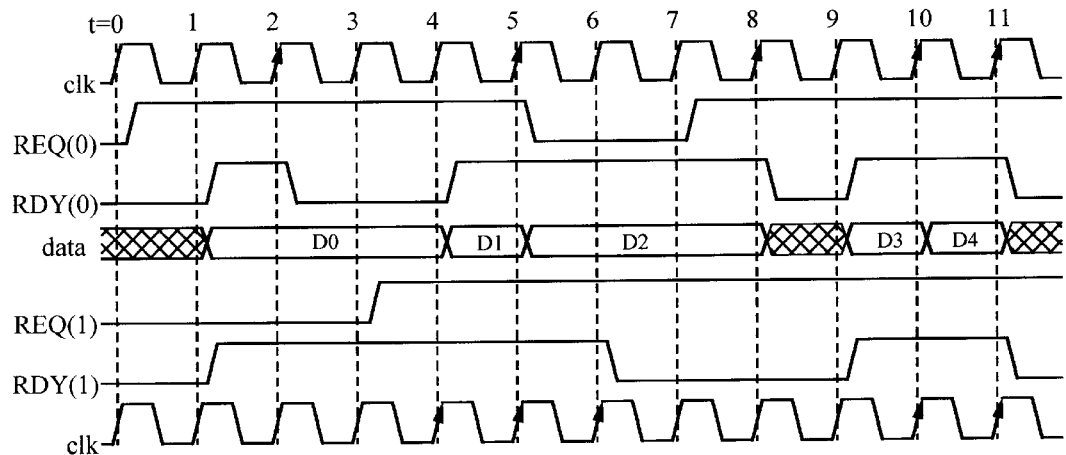
FIG. 3 shows an exemplary control signal and token transfer sequence for a broadcast interface having two receivers, according to the present invention.

In the following description, a pipestage is understood to be a circuit which includes a finite state machine (FSM). A core is understood to be a circuit including plural interconnected pipestages. The statement that a first token is derived from a second token is understood to mean that the first token is either equal to the second token or is generated by processing the second token and possibly other tokens. The statement that two signals are asserted with a predetermined synchronous relationship is understood to mean that the first signal is asserted a predetermined number of clock cycles before the second signal, or that the two signals are asserted synchronously, where the predetermined number of clock cycle is fixed for a given interface. The statement that two signals are asserted synchronously is understood to mean that both signals are asserted simultaneously with a clock signal such as the rising or falling edge of a clock waveform. The statement that a token is transferred synchronously with a first signal and a second signal is understood to mean that the token transfer occurs on the same clock cycle as the synchronous assertion of the first and second signals. A set of elements is understood to contain one or more elements.

The following description illustrates embodiments of the invention by way of example and not necessarily by way of limitation.

FIG. 1 shows a diagram of an exemplary integrated circuit device 20 according to the preferred embodiment of the present invention. Device 20 may be part of a larger system integrated on a single chip. Device 20 may also form essentially the entire circuit of a chip. Device 20 has a data flow (data driven) architecture, in which operations are controlled by the flow of data through the device. By contrast, a device using a conventional von Neumann architecture is driven by a central controller.

Device 20 comprises a plurality of interconnected data-driven cores (functional blocks, intellectual property) 22 integrated on the chip. Each of cores 22 is of at least a finite-state machine complexity. Each of cores 22 may typically have anywhere from hundreds to millions of gates, with common cores having thousands to tens of thousands of gates. Examples of suitable cores include digital signal processing (DSP) modules, discrete cosine or inverse cosine transform (DCT, IDCT) modules, arithmetic logic units (ALU), central processing units (CPUs), bit stream parsers, and memory controllers. Preferably, each of cores 22 performs a specialized predetermined function.

The operation of cores 22 is driven by the flow of data therethrough. Cores 22 are connected to off-chip electronics through plural input interfaces 24a–b and output interfaces 26a–c. Some of cores 22 have plural inputs (e.g. cores 1, 3, 4, 5), some have plural outputs (e.g. cores 0, 1, 3), while some have a single input and a single output (e.g. core 2). Some outputs may be connected to the input of plural cores, as illustrated by the connection of the output of core 4 to inputs of cores 1 and 5. The core arrangement in FIG. 1 is shown for illustrative purposes. Various other arrangements can be used for implementing desired functions.

FIG. 2-A illustrates a core 22a and its connections to a number of other cores 22b–f. Cores 22a–f are interconnected through dedicated standard interfaces of the present invention, as described in more detail below. Preferably substantially all of the interfaces of device 20 are such standard interfaces. Each interface is fully synchronous and registered. There are no combinational paths from any core input to any core output. Each core 22a–f has a clock connection and a reset connection for receiving external clock (clk) and reset (rst) signals, respectively. For simplicity, the clock and reset connections are illustrated in FIG. 2-A only for core 22a.

Core 22a is connected to cores 22b–c through input interfaces 23b–c, respectively. Core 22a is connected to core 22d through a simple output interface 23d, and to cores 22e–f through a broadcast interface 23e. Each interface comprises a data connection (thick arrow), and a pair of control connections for each transmitter-receiver core pair. Each control connection pair comprises a request connection and a ready connection. Each request and ready connection is preferably a unidirectional one-bit connection, and is dedicated to a given transmitter-receiver core pair. Each data connection is preferably a unidirectional multiple-bit connection.

Each of input interfaces 23b–c comprises an input request connection for asserting an input request signal IREQ, an input ready connection for receiving a corresponding input ready signal IRDY, and an input data connection (thick arrow) for receiving an input token. Each output interface 23d–e comprises an output data connection (thick arrow) for transmitting an output token, and an output request-output ready connection pair for asserting an output ready signal ORDY and receiving an output request signal OREQ, respectively. Broadcast interface 23e comprises two control connection pairs, one for each of cores 22e and 22f, as illustrated in FIG. 2-B.

An acknowledge condition ACK is defined as being met when both signals REQ and RDY of a given control connection pair are asserted with a predetermined synchronous relationship. That is, ACK is met when the number of clock cycles elapsed between the assertions of the REQ and RDY signals is equal to some integer (e.g. one or two) which is predetermined (fixed) for a given interface. For example, if the integer is one, ACK may be met upon assertion of REQ one clock cycle after assertion of RDY. The integer is preferably zero, i.e. ACK is met when REQ and RDY are asserted synchronously.

A token is transferred over a data connection only if an acknowledge condition ACK is met for the control connection pair corresponding to the data connection. The token transfer preferably occurs synchronously with the meeting of ACK, but may also occur a predetermined integer number (e.g. one or two) of clock cycles after ACK is met. Transferring tokens synchronously with assertion of REQ and RDY provides for reduced data transfer times and relatively simple control logic as compared to a similar interface requiring a predetermined clock cycle delay between the assertions of REQ and RDY, or between ACK and token tranfer, as will be apparent from the description below.

Simultaneous assertion of RDY and REQ signals on a clock cycle as described above is preferably necessary and sufficient for effecting token transfer on the same clock cycle. No other signals are required for establishing, maintaining, or terminating token transfer. Any core 22 can stall the transfer of tokens to and from itself on any given clock cycle.

Core 22a receives a first input token from core 22b upon a first input acknowledge (IACK) condition on interface 23b, and a second input token from core 22c upon a second IACK condition on interface 23c. Data processing logic within core 22a generates first and second output tokens from the first and second input tokens. Core 22a transmits the first outout token to core 22d upon a first output acknowledge (OACK) condition on interface 23d. Core 22a transmits the second output token to cores 22e–f. The second output token is transmitted to core 22e upon an OACK condition on the corresponding control connection pair connecting cores 22a and 22e. Similarly, the second output token is transmitted to core 22f upon an OACK condition corresponding to the control connection pair connecting cores 22a and 22f.

Core 22a asserts an input request signal IREQ only if core 22a is ready to accept a corresponding input token. Similarly, core 22a asserts an output ready signal ORDY only if it is ready to transmit a corresponding output token. For broadcast interface 23e, core 22a asserts an output ready signal ORDY to a given receiver core 22e or 22f only if core 22a is ready to transmit an output token and the given receiver has not yet received that output token. The ORDY signal to core 22e is de-asserted if core 22f has not received yet the latest token transmitted to core 22e. Similarly, the ORDY signal to core 22f is de-asserted if core 22f has not received yet the latest token transmitted to core 22e.

FIG. 3 illustrates the control and data transfer timing for an exemplary token transfer sequence for broadcast interface 23e. The clock edges on which tokens are transferred from core 22a to cores 22e–f are marked by arrows on the top and bottom clock waveforms, respectively. All control signals are active high. Shaded areas in the data row indicate time periods for which no tokens are available for transfer (RDY (j)=0, j=0,1). The values D0, D1, etc. in the data row indicate the identities of the output tokens transferred from core 22a to cores 22e–f.

For t=1, core 23e requests a token (REQ(0)=1), but no token is transferred since RDY(0) is inactive. A token D0 becomes available for transfer after t=1. Consequently, core 22a activates RDY(0) and RDY(1). Token D0 is transferred to core 22e at t=2. Core 22a de-asserts RDY(0) after t=2, until core 22f receives token D0 at t=4. A token D1 is received by both cores 22e and 22f at t=5. A token D2 is received by core 22f at t=6, and by core 22e at t=8. No token is available for transfer at t=9. Tokens D3 and D4 are transferred to both cores 22e–f at t=10 and t=11, respectively.

Figure 4:
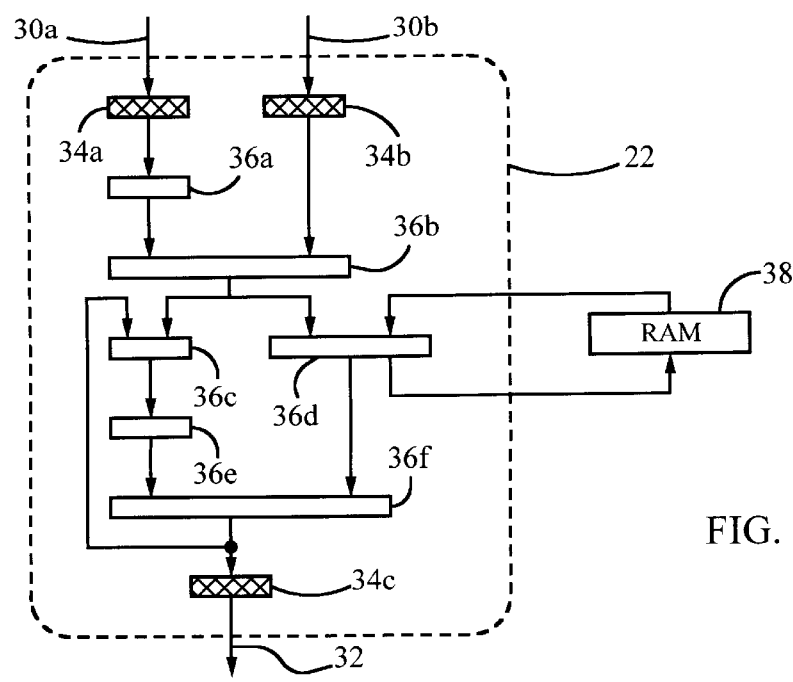
FIG. 4 is a diagram of an exemplary core according to the preferred embodiment of the present invention.

FIG. 4 illustrates the internal structure of an exemplary core 22 of the present invention. Core 22 is connected to other on-chip cores or off-chip electronics through input interfaces 30a–b and an output interface 32. Core 22 may also be connected to on-chip or off-chip components such as a random access memory (RAM) 38. Core 22 comprises a plurality of interconnected pipestages, including core interface pipestages 34a–c and internal pipestages 36a–f. Pipestages 34a–c and 36a–f are of at least finite state machine (FSM) complexity. Pipestages 34a–c and 36a–f may have on the order of tens to tens of thousands of gates, with typical pipestages having on the order of hundreds to thousands of gates. Some of internal pipestages 36a–f have multiple inputs and/or outputs. Some pipestage connections may form feedback loops, as illustrated by the feeding of the output of pipestage 36f to an input of preceding pipestage 36c. Each of input interface pipestages 34a–b has a single input, while output pipestage 34c has a single data output connected to one or more external pipestages/cores.

Finite state machines include combinational logic (CLC) and at least one register for holding a circuit state. Finite state machines can be classified into two broad categories: Moore and Mealy. A Mealy FSM may have combinational paths from input to output, while a Moore FSM does not have any combinational paths from input to output. The output of a MeaLy FSM for a given clock cycle depends both on the input(s) for that clock cycle and its state. The output of a Moore FSM depends only on its state for that clock cycle. FIG. 5-A illustrates schematically a Moore FSM 40, while FIG. 5-B illustrates schematically a Mealy FSM 44.

Core interface pipestages 34a–c are preferably Moore FSMs. Consequently, there are no combinational paths through a core, and the output of a core for a given clock cycle does not depend on the core input for that clock cycle. The absence of combinational paths through the cores eases the integration and reusability of the cores into different devices, and greatly simplifies the simulation and verification of the final device.

Internal pipestages 36a–f can be Mealy or Moore FSMs. For a core including Mealy FSM internal pipestages, there may be some combinational paths through the internal pipestages. Combinational paths are acceptable within cores 22, since each of cores is generally smaller than device 20 and thus relatively easy to simulate and verify, and since the internal functioning of cores 22 is not generally relevant to the system integrator building a system from pre-designed cores. Combinational paths through internal pipestages can even be desirable in some circumstances, if such combinational paths lead to a reduction in the processing latency or core size required to implement a desired function.

FIG. 6-A illustrates the preferred structure of an internal pipestage 36 having multiple inputs and multiple outputs.

Pipestage 36 comprises control logic defining a control path 50, and data processing logic defining a data path 52. Data path 52 comprises plural levels of token registers 53a–b and plural levels of data processing combinational logic circuits (CLC) 51a–c arranged sequentially along data path 52. Token registers 53a are situated in the data path between CLCs 51a and 51b, while token registers 53b are situated in the data path between CLCs 51b and 51c. The outputs of token registers 53a–b are further connected to the inputs of CLCs 51a–b through feedback connections 55. Input CLC 51a is connected to outputs of other pipestages over an input data connection 57. Output CLC 51c is connected to inputs of other pipestages over an output data connection 59.

Input CLC 51a receives input tokens from external pipestages and an internal token from token registers 53a, processes the received tokens and makes the result available for storage as an internal token in token registers 53a. Token registers 53 store the internal token received from input logic 51, and make it available to CLC 51b and CLC 51a at least one clock cycle after storage. CLC 51b processes the internal token received from token registers 53a and another internal token received from token registers 53b to generate an internal token which is made available for storage in token registers 53b. Token registers 53b make the stored internal token available for transmittal to CLC 51a–c at least one clock cycle after storage. CLC 51c receives the internal token stored token registers 53b, processes the internal token, and sends resulting output tokens to other pipestages.

Control path 50 comprises input interface control logic 54, internal pipestage control logic 58, and output interface control logic 60. Input control logic 54 is connected to output interfaces of other pipestages. Output control logic 60 is connected to input interfaces of other pipestages. Input control logic 54 is needed only if pipestage 36 receives input tokens from more than one pipestage. Similarly, output control logic 60 is need only if pipestage 36 sends output tokens to more than one pipestage. Internal control logic 58 is situated in the control path between input control logic 54 and output control logic 60. Internal control logic 58 is further connected to token registers 53a–b and CLCs 51a–c through data processing control connection pairs 61. For clarity of presentation, each pair 61 of unidirectional control connections is illustrated as a single line in FIG. 6-A.

Control logic 58 sends to token registers 53a–b corresponding load-enable signals for controlling the loading of tokens by token registers 53a–b, and transmit-enable signals for controlling the transmission of tokens by token registers 53a–b. Control logic 58 further sends corresponding data processing control signals to CLCs 51a–c, for controlling the data processing performed by CLCs 51a–c. Control logic 58 receives status signals from CLCs 51a–c and token registers 53a–b. The status signals can include information such as the number of tokens stored in registers 53a–b, the type of data processing performed by CLCs 51a–c on a given clock cycle, and flags such as SIGN and OVERFLOW. The status signals are used by control logic 58 in controlling the operation of token registers 53a–b and the algorithmic functioning of CLCs 51a–c.

Input control logic 54 sends and receives control data to and from external output interfaces and internal control logic 58. Output control logic 60 sends and receives control data to and from external input interfaces and control logic 58. The control signals received from control logic 54 and 60 are used, in conjunction with the status signals received from token registers 53a–b and CLCs 51a–c and state data stored within control logic 58, to control the operation of token registers 53a–b and CLCs 51a–c.

FIG. 6-B shows input control interface logic 54. Input interface logic 54 has K pairs of external connections 62 (0 . . . K–1, K≧1) to other pipestages, and K+1 internal connections 64 to control logic 58. Each pair of connections 62 includes a one-bit external input request connection for asserting an input request signal IREQ(j) to the external pipestage corresponding to the pair, and a one-bit external input ready connection for receiving an input ready signal IRDY(j) from the external pipestage corresponding to the pair. Connections 64 include K one-bit internal input request connections for receiving corresponding internal input request signals IREQX(j) from control logic 58, and a one-bit internal input ready connection for asserting an internal input ready signal IRDYX to control logic 58.

Input interface logic 54 generates the internal ready signal IRDYX in response to the external signals IRDY(j) according to the relation $$\text{IRDYX}=\&(!\text{IREQX}(j)|\text{IRDY}(j)), j=0 \ldots K-1, \qquad [1]$$

where "&," "!" and "|" are the AND, NOT, and OR operators, respectively. Eq. [1] states that the internal ready signal IRDYX is asserted on a given clock cycle if IREQX(j)=0 or IRDY(j)=1 for each j=0 . . . K–1. The signal IRDYX is not asserted if IREQX(j)=1 and IRDY(j)=0 for at least some j. In other words, IRDYX=1 only if all requested tokens (those for which IREQX(j)=1) are also available (IRDY(j)=1). If there is any token which is requested (IREQX(j)=1) but is not ready (IRDY(j)=0), none of the requested tokens can be accepted (IRDYX=0).

Input interface logic 54 generates the signals IREQ(j) from the signals IREQX(j) according to one of relations $$\text{IREQ}(j)=\text{IREQX}(j)\&\text{IRDYX}, \qquad [2a]$$

$$\text{IREQ}(j)=\text{IREQX}(j)\&(\&(!\text{IREQX}(j')|\text{IRDY}(j'))), \\ j'=0 \ldots j-1, j+1 \ldots K-1. \qquad [2b]$$

Eq. [2a] states that a request signal IREQ(j) corresponding to a token is asserted only if control logic 58 requests that token (IREQX(j)=1), and all tokens requested by control logic 58 are available (IRDYX=1). Using eq. [2a] leads to a combinational path between IRDY(j) and IREQ(j), which may be undesirable if an unstable combinational closed loop is formed through input interface logic 54 and a pipestage connected to an input of pipestage 36.

Using eq. [2b] removes that combinational path by replacing the IRDYX in eq. [2a] with the result of an AND operation performed on (!IREQX(j')|IRDY(j')) over j'≠j. Control logic 58 controls token registers 53a to load corresponding tokens upon synchronous assertion of IRDYX and IREQX(j). The transfer of the jth token occurs upon synchronous assertion of IREQ(j) and IRDY(j). Input interface logic 54 effectively serves to condition the transfer of each token on the availability of all tokens requested, and to prevent assertion of any IREQ(j) signal if not all requested (IREQX(j)=1) tokens are available.

FIG. 6-C illustrates output control interface logic 60. Logic 60 comprises a pair of internal one-bit connection 66 to control logic 58, and K' pairs of external one-bit connections 68 (0 ... K'−1, K'≧1) to other pipestages. Each pair of connections 68 includes an external output ready connection for asserting an output ready signal ORDY(j) to the external pipestage corresponding to the pair, and an external output request connection for receiving an output request signal OREQ(j) from the external pipestage corresponding to the pair. Connections 66 include an internal output ready connection for receiving an internal output ready signal ORDYX from control logic 58, and an internal output request connection for asserting an internal output request signal OREQX to control logic 58.

Output interface logic 60 generates the internal request signal OREQX in response to the external signals OREQ(j) according to the relation $$OREQX = \&(OREQ(j')), j'=0 \ldots K'-1. \quad [3]$$

The internal request signal OREQX is asserted on a given clock cycle if all external pipestages connected to output interface logic 60 assert their respective signals OREQ(j) on that clock cycle, signaling that all the pipestages are ready to accept their corresponding output tokens.

Output interface logic 60 generates the external request signals ORDY(j) according to one of the relations $$ORDY(j) = ORDYX \& (\&(OREQ(j'))), j'=(0 \ldots K'-1), \quad [4a]$$

$$ORDY(j) = ORDYX \& (\&(OREQ(j'))), j'=(0 \ldots j-1, j+1 \ldots K'1). \quad [4b]$$

Eq. [4a] states that each signal ORDY(j) for j=0 ... K'−1 is asserted if ORDYX and all OREQ(j') signals (j'=(0 ... K−1)) are asserted. Eq. [4b] states that each signal ORDY(j) is asserted if ORDYX and all OREQ(j') signals except OREQ(j'=j) are asserted (j'=(0 ... j−1, j+1 ... K−1)).

If condition [4a] is used, there is a combinational path between OREQ(j) and ORDY(j). Such a combinational path may lead to instability if a closed combinational loop is formed through output interface logic 60 and the pipestage connected to output interface logic 60. Condition [4b] may be used to break such a combinational path if desired.

The signals IREQ(j) and ORDYX are generated by core control circuit 58 according to, among others, control TAG values indicative of the numbers of tokens stored in token registers 53a–b. The numbers of tokens stored in token registers 53a–b are in turn indicative of the present capabilities of token registers 53a–b to store and transmit tokens. The TAG values are stored in control TAG registers within control circuit 58. The TAG registers may include state data other than the number of tokens stored in token registers 53a–b. Examples of such state data include numbers of particular token pairs received by pipestage 36, tags indicating whether a particular token has been received, and tags indicative of the internal operations performed by CLCs 51a–c on a given token.

Token registers 53a are controlled by control logic 58 to load internal tokens received from CLC 51a only on IACKX, when IRDYX is asserted and the TAG data indicate that token register 53a is not full. Similarly, token registers 53b are controlled by control logic 58 to transmit stored internal tokens to CLC 51c only on OACKX, when OREQX is asserted and the FAG data indicate that token registers 53b are not empty.

FIG. 7 shows a pipestage 136 having a single input and a single output. The data path of pipestage 136 consists of a CLC 151a, token registers 153, and a CLC 151b connected in sequence. The control path 150 consists of internal control logic 158. The signals IREQX and IRDYX are now the same as IREQ and IRDY. Similarly, the signals OREQX and ORDYX are identical to the external signals OREQ and ORDY. The TAG register of control logic 158 may contain a single value equal to the number of tokens stored in token registers 153.

FIG. 8-A shows a preferred state diagram for core control circuit 158, illustrating the transitions between different TAG states and the IREQ and ORDY values for each TAG state. As shown, the TAG value stored in the TAG register is equal to the number of internal tokens stored in token registers 153. The TAG value can vary between zero and a maximum value SIZE equal to the maximum number of tokens which may be stored in token registers 153. The values of IREQ and ORDY generated by control circuit 158 are 1 for TAG=j, 0<j<SIZE. Pipestage 136 is ready to receive and transmit tokens if token registers 153 are neither full nor empty. For TAG=0, IREQ=1 and ORDY=0. Pipestage 136 is ready to accept but not transmit tokens if token registers 153 are empty. For TAG=SIZE, IREQ=OREQ and ORDY=1. If token registers 153 are full, pipestage 153 is ready to transmit tokens, and may also accept a token if another token leaves at the same time.

The TAG value is incremented by one whenever a token is stored in token registers 153 and no token leaves token registers 153 (IACK=1 and !OACK=1, where "!" denotes the NOT operator). Similarly, the TAG value is decremented by one whenever a token leaves and no token is stored in token registers 153 (!IACK=1 and OACK=1). The TAG value remains unchanged if one token leaves and one enters token registers 153 (IACK=1 and OACK=1), or no token leaves or enters token registers 153 (IACK=0 and OACK=0).

FIG. 8-B shows a state diagram for a core control circuit having a one-bit tag. The diagram of FIG. 8-B is a particularization of the state diagram of FIG. 8-A for SIZE=1. If TAG=0, the control circuit generates IREQ=1 and ORDY=0. If TAG=1, the control circuit generates IREQ2=OREQ and ORDY=1. The above signal generation conditions can be rewritten to express ORDY and IREQ as functions of TAG, OREQ and IRDY as $$ORDY = TAG \quad [5a]$$

$$IREQ = !TAG|OREQ, \quad [5b]$$

where "|" denotes the OR operator. The transition from TAG=0 to TAG=1 occurs for IRDY=1, while the transition from TAG=1 to TAG=0 occurs when !IRDY=1 and OREQ=1. The above state transition conditions can be re-written to express the next value TAG' as a function of TAG, OREQ and IRDY as $$TAG' = !TAG\&IRDY|TAG\&!(!IRDY\&OREQ), \quad [6a]$$

which in turn can be rewritten as $$TAG' = IRDY|(TAG\&!OREQ). \quad [6b]$$

FIGS. 9-A and 9-B show circuits suitable for implementing equations [5a–6b]. FIG. 9-A shows a circuit 80 having all inputs (IRDY and OREQ) and outputs (IREQ and ORDY) active high. An OR gate 82 has IREQ as its output, and OREQ and !ORDY as its inputs. An AND gate 84 has !OREQ and ORDY as its inputs. The output of gate 84 is connected to an input of an OR gate 86. Gate 86 has IRDY as its other input. The output of gate 86 is connected to the input of a one-bit TAG register 88. The output of register 88 is ORDY.

FIG. 9-B shows a circuit 90 having active-high connections on the request path (IREQ and OREQ), and active-low connections on the ready path ($\overline{IRDY}$ and $\overline{ORDY}$). An OR gate 92 has OREQ and $\overline{ORDY}$ as its inputs, and IREQ as its output. An OR gate 94 has OREQ and $\overline{ORDY}$ as its inputs. A NAND gate 96 has $\overline{IRDY}$. and the output of gate 94 as its inputs. The output of NAND) gate 94 is connected to the input of a TAG register 98. After inversion, the output of register 98 is $\overline{ORDY}$.

As discussed above with reference to FIG. 4, core interface pipestages such as pipestages 34a–c are preferably Moore FSMs. Core interface pipestages 34a–c require at least one level of registers in both the control and data paths. To allow core 22 to operate at one token per cycle, with no bubbles, it is preferred that each of pipestages 34a–c have a second level of registers in the data path. Adding a second level of registers allows input pipestages 34a–c to request a token even if a token is present in the first register level.

FIG. 10 shows a configuration 100 suitable for token registers of core input and output pipestages. The inputs of a first register R0 and a second register R1 are connected in parallel to a common input 102 of configuration 100. The outputs of registers R0 and R1 are connected to the two inputs of a multiplexer 104. The output of multiplexer 104 is the output 106 of configuration 100. Registers R0 and R1 and multiplexer 104 are controlled by a pipestage control circuit (not shown) through connections 105a–c, respectively. Configuration 100 has five states: no token in R0 and R1; token only in R0; token only in R1; token in both R0 and R1, with token in R0 coming first; token in both R0 and R1, with token in R1 coming first. At least three bits are stored in the TAG register of the control circuit in order to characterize the five states.

FIG. 11-A shows a preferred configuration 110 for token register of a core input pipestage such as pipestage 34a (shown in FIG. 4). Referring to FIG. 11-A, the input of register R0 is the input 112 of configuration 110. The output of register R0 is connected to one input of multiplexer 104 and to the input of register R1. The output of register R1 is connected to the other input of multiplexer 104. The output of Multiplexer 104 is the output 116 of configuration 110. Multiplexer 104 controls which register output (R0 or R1) is chosen as the configuration output for a given clock cycle.

Configuration 110 specifies the order of the tokens in R0 and R1 implicitly, since the token in R1 always comes before the token in R0. Thus, configuration 110 has a maximum of four states, which can be represented by two bits in the TAG register of the control circuit. The four potential states are: no token in R0 or R1 (TAG=0), token only in R0 (TAG=1), token only in R1 (TAG=2), token in both R0 and R1 (TAG=3). The capability of configuration 110 to be characterized using only two TAG register bits makes configuration 110 advantageous for use in an interface pipestage.

Furthermore, configuration 110 has a loading of one (single input: loading). Also, tokens are loaded directly into a register (R0), which allows reduced set-up times. The single input loading and reduced set-up times make configuration 110 particularly advantageous for use in an input interface pipestage.

Potential state transitions for configuration 110 are shown in FIG. 11-B. Different possibilities for transitions are shown as dashed lines. The first number next to each transition represents the value of IRDY, while the second number represents the value of OREQ. The letter "X" next to the arrows on FIG. 11-B means that the transition occurs no matter what the value of X(0 or 1). For example, 01 marks the transition occurring for IRDY=0 and OREQ=1, while 1X marks the transition occurring for IRDY=1 and any value of OREQ. If the output of configuration 110 is connected to multiple pip stages, OREQ can be simply replaced by OREQX=& (OREQ(j)).

Received tokens are first stored in R0. A token stored in R0 can then be either moved to R1 or sent forward through multiplexer 104. A token stored in R1 can only be sent forward through multiplexer 104. Preferably, register R0 is loaded on IACK (IREQ=1 and IRDY=1), while register R1 is loaded on (TAG==1) &IRDY&!OREQ. The select line 105c of multiplexer 104 is controlled by TAG(1), the second bit of TAG. Multiplexer 104 selects the token received from register R1 when R1 is full (TAG=3), and selects the token received from R0 otherwise.

FIG. 11-C illustrates the preferred state transitions for configuration 110, using the notation convention of FIGS. 8-A and 8-B. The first number next to each transition represents the value of IRDY, while the second number represents the value of OREQ. For TAG=0 (registers R0 and R1 empty), IREQ=1 and ORDY=0. If a token is then received (IRDY=1), it is stored in R0 and the TAG value is incremented to 1.

For TAG=1 (register R0 full), configuration 110 is ready to receive or send a token (IREQ=1 and ORDY=1). The token is kept in R0 if no tokens are sent or received (IRDY=0 and OREQ=0). If a token is received while one is sent out (IRDY=1 and OREQ=1), the received token is stored in R0. This 11 transition for TAG=1 allows configuration 110 to operate sustainably at one token per cycle, without bubbles. If a second token is received while the first token is not requested (IRDY=1 and OREQ=0), the first token is moved to R1, the second token is stored in R0, and the TAG value is set to 3. If no token is received while one is requested (IRDY=0 and OREQ=1), the token in R0 is sent out and TAG is decremented to 0.

For TAG=3 (registers R0 and R1 full), configuration 110 is ready to send but not receive a token (IREQ=0 and ORDY=1). If a token is requested (OREQ=1), the token in R1 is sent out and TAG is set to 1.

The above-described correspondence between TAG values and IREQ and ORDY signals can be re-written as:

| IREQ=!TAG(1) | [7a] |
|---|---|
| ORDY=TAG(0), | [7b] | while the state transitions can be used to express the next bit values TAG'(0) and TAG'(1) as functions of TAG(0), TAG (1), OREQ and IRDY as

| TAG'(0)=IRDY\|TAG(0)&!OREQ\|TAG(1), | [8a] |
|---|---|
| TAG'(1)=TAG(0)&!OREQ&(IRDY\|TAG(1)). | [8b] | where TAG(0) and TAG(1) are the first and second bits of TAG, respectively. TAG(0) indicated whether register R0 is full while TAG(1) indicated whether register R1 is full.

FIG. 12-A shows a preferred configuration 120 for token registers of a core output pipestage such as pipestage 34c (shown in FIG. 6). Referring to FIG. 12-A, the input 122 of configuration 120 is connected to the input of register R1 and to an input of multiplexer 104. The output of register R1 is connected to the other input of multiplexer 104. The output of Multiplexer 104 is connected to the input of register R0. The output of register R0 is the output 126 of configuration 120.

Configuration 120 specifies the order of the tokens in R0 and R1 implicitly. The four potential states of configuration 120 are: no token in R0 or R1 (TAG=0), token only in R0 (TAG=1), token only in R1 (TAG=2), token in both R0 and R1 (TAG=3). As described above, the capability of configuration 120 to be characterized using only two TAG register bits makes configuration 120 advantageous for use in an interface pipestage. Furthermore, its direct register output and resulting reduced clock-to-output delay make configuration 120 particularly advantageous for use in an output interface pipestage.

Potential state transitions for configuration 120 are shown in FIG. 12-B, using the notation convention of FIG. 11-B. Received tokens can be first stored in R0 or R1. A token stored in R1 can then be moved to R0 through multiplexer 104. A token stored in R0 can only be sent forward. Multiplexer 104 selects tokens for storage in register R0 and further transmittal to output 126.

FIG. 12-C illustrates the preferred state transitions for configuration 120. For TAG=0 (registers R0 and R1 empty), IREQ=1 and ORDY=0. If a token is then received (IRDY=1), it is stored in R0 and the TAG value is incremented to 1.

For TAG=1 (register R0 full), configuration 120 is ready to receive or send a token (IREQ=1 and ORDY=1). The token is kept in R0 if no tokens are sent or received (IRDY=0 and OREQ=0). If a token is received while one is sent (IRDY=1 and OREQ=1), the received token is stored in R0. If a second token is received while the first token is not requested (IRDY=1 and OREQ=0), the second token is stored in R1 and the TAG value is set to 3. If no token is received while one is requested (IRDY=0 and OREQ=1), the token in R0 is sent out and TAG is decremented to 0.

For TAG=3 (registers R0 and R1 full), configuration 120 is ready to send but not receive a token (IREQ 0 and ORDY=1) If a token is requested (OREQ=1), the token in R0 is sent out and TAG is set to 1.

As discussed above with reference to FIGS. 2-A, 2-B and 3, some cores 22 may send the same token to multiple other cores through a broadcast output interface such as interface 23e. Preferably, the control logic of a core output pipestage with a broadcast interface includes, in addition to a TAG register, a DONE register for keeping track of which cores have received a given token. The state of the broadcast interface is then defined by the values in the TAG and DONE registers.

Consider a broadcast interface having a common data output connected to K external cores, and K pairs of control connections for sending/receiving ORDY(j)/OREQ(j) signals to the external cores. The DONE register has one bit for each OREQ(j)/ORDY(j) (j=0 . . . K−1) control signal handshake pair of the broadcast interface. For each value of TAG there are $2^k-1$ DONE register values/states. The state with all DONE bits equal to 1 cannot be reached. Once a token has been delivered to all its destinations, all DONE values are reset to zero and the TAG register is updated.

The preferred state diagram for a broadcast interface is similar to that of FIG. 12-B, with the state transitions determined by an input acknowledge signal IACK and by a global output acknowledge signal $$OACKX=\&(OACK(j)), j=0 \ldots K-1. \quad [9]$$

The value of TAG is incremented when a new token is received (IACK=1), and decremented when a token has been sent to all receivers (OACKX=1). The output ready signals ORDY(j) are given by $$ORDY(j)=TAG(0)\&(!DONE(j)), \quad [10]$$

where TAG(0) is the first bit of TAG. That is, the broadcast interface signals a readiness to transfer a token to the jth receiver if register R0 is full (TAG(0)=1) and if that token has not yet been transferred to that receiver (DONE(j)=0).

The output handshake condition OACK(j) in eq. [9] is preferably given by $$OACK(j)=ORDY(j)\&OREQ(j)|DONE(j). \quad [11]$$

That is, the condition OACK(j)=1 is met if a token is being transferred (ORDY(j) &OREQ(j)=1) or if it has been transferred in the past (DONE(j)=1) to the jth receiver. From eqs. [9] and [11] it can be seen that the condition OACKX=1 is met if a given token is being or has been transferred to all receivers of the broadcast interface. The next value of DONE'(j) is given by $$DONE'(j)=(!OACKX)\&OACK(j), \quad [12]$$

where OACK(j) is given by eq. [11]. The value of DONE'(j) is reset to zero if OACKX=1, and is otherwise set to 1 if a token is being transferred or has been transferred.

As illustrated in FIG. 4, some pipestages such as pipestage 36d may be connected to an on-chip random access memory (RAM). Connections to RAM are preferably achieved through specialized interfaces having address connections. FIG. 13-A illustrates a preferred interface 200 for an on-chip single port synchronous RAM. Interface 200 comprises a write/control interface 202 for transmitting control signals and write data to the RAM, and a read data interface 204 for receiving read data from the RAM. Write/control interface 202 preferably comprises a one-bit read enable connection for asserting a read enable (rde) signal, a one-bit write enable connection for asserting a write enable (wre) signal, a multi-bit address connection for sending a read or write address, and a multi-bit write data connection for sending write data to be stored in the RAM. Read data interface 204 comprises a multi-bit read data connection for receiving data stored in the RAM. Interfaces 202 and 204 are coupled through logic connecting the read enable connection and the address connection to the read data connection, for controlling data transfer over interface 204 according to the signals asserted over interface 202. Writing data to the RAM is achieved by asserting a write enable signal wre synchronously with sending a write address and data to be written. Reading data is achieved by asserting a read enable signal rde synchronously with sending a read address.

FIG. 13-B shows a preferred interface 300 for an on-chip dual-port RAM. Interface 300 comprises a write control/write data interface 302, a read control interface 304, and a read data interface 306. Interface 302 comprises a write enable connection, a write address connection, and a write data connection, all similar to the connections described above for interface 202. Interface 304 comprises a read enable connection for asserting a read enable signal rde, and a read address connection for sending a read address. Interface 306 comprises a read data connection for receiving read data from the RAM. Interfaces 302 and 304 are coupled through logic connecting the write enable, read enable, write address, and read address connection, for ensuring that the same address is not simultaneously accessed for reading and writing data. Similarly, interfaces 304 and 306 are coupled through logic for controlling the transfer of data over interface 306 according to the signals asserted over interface 304. Interface 300 allows reading and writing to be performed simultaneously, as long as the same address is not accessed for both reading and writing data.

The above-described system architecture and interface allow a relatively simple and robust method for designing a device of the present invention. In particular, the architecture and interface allow relatively simple and efficient simulation and verification of the device. Any desired functionality is implemented by simply interconnecting pre-designed and pre-tested cores of the present invention. The core integration depends only on the functionality expressed on the core interfaces, and not on the internal structure of the cores.

Each core is designed and verified prior to integration. For the design of each core, a core representation is first developed in C, Verilog, or VHDL to study algorithmic and architectural design tradeoffs. The design may then be modified at the RTL or even cycle-accurate model level until the resulting core approaches a desired optimum. Synthesized core representations are maintained in a library for use in multiple devices.

The architecture allows simple integration of additional cores in a design. The internal functioning of the cores is not relevant to the system integrator, as long as the core functionality on the interfaces is known. No master controller, programming, or microcode are required. The cores can be optimized to perform efficiently a given predetermined function, using a minimal number of gates. The architecture provides a unique solution to the ever-increasing problem of system design for large systems integrated on a chip.

It will be clear to one skilled in the art that the above embodiments may be altered in many ways without departing from the scope of the invention. For example, each pipestage need not contain data processing logic. In a pipestage without input data processing logic, internal tokens stored in token registers may be equal to input tokens received by the pipestage. Similarly, in a pipestage without output data processing logic, output tokens transmitted by the pipestage may be equal to internal tokens stored in token registers. The ready and request signals may be multi-bit signals. Additional register levels may be added in the control and/or data paths if the system employs ACK conditions requiring time delays between the assertion of RDY/REQ signals, or if tokens are transferred a non-zero number of clock cycles after IACK. For example, adding a one-clock cycle delay for a given control (REQ or RDY) signal can be achieved simply by adding a register level in the control path corresponding to that signal. If large on-chip memories are required, cores may be connected to on-chip pipelined RAM allowing access times of more than one clock cycle. Asynchronous RAM may be used to generate a synchronous memory by coupling registers to all connections from cores to RAM. Accordingly, the scope of the invention should be determined by the following claims and their legal equivalents.

What is claimed is:

1. A data processing system comprising a first data-driven core, a second data-driven core, and a third data-driven core integrated on a chip, said first core comprising:
   a) a first input interface connected to said second core, comprising
      a first input request connection for asserting a first input request signal to said second core,
      a first input ready connection for receiving a first input ready signal asserted by said second core, and
      a first input data connection for receiving a first input token from said second core;
   b) data processing logic connected to said first input data connection, for generating a first output token from said first input token;
   c) a first output interface connected to said data processing logic and said third core, comprising
      a first output request connection for receiving a first output request signal asserted by said third core,
      a first output ready connection for asserting a first output ready signal to said third core, and
      a first output data connection connected to said data processing logic, for transmitting said first output token to said third core;
   d) first input control logic connected to said first input interface, for controlling said first core to receive said first input token if said first input request signal and said first input ready signal are asserted with a predetermined synchronous relationship; and
   e) first output control logic connected to said first output interface, for controlling said first core to transmit said first output token to said third core if said first output request signal and said first output ready signal are asserted with a predetermined synchronous relationship.

2. The system of claim 1 wherein:
   a) said first input control logic comprises logic for controlling said first core to receive said first input token if said first input request signal and said first input ready signal are asserted synchronously; and
   b) said first output control logic comprises logic for controlling said first core to transmit said first output token to said third core if said first output request signal and said first output ready signal are asserted synchronously.

3. The system of claim 2 wherein:
   a) said first input control logic comprises logic for controlling said first core to receive said first input token synchronously with said first input request signal and said input ready signal; and
   b) said first output control logic comprises logic for controlling said first core to transmit said first output token synchronously with said first output request signal and said output ready signal.

4. The system of claim 1 wherein:
   a) said data processing logic comprises logic for generating a second output token from said first input token;
   b) said first core further comprises a second output interface connected to said data processing logic and to a fourth core integrated on said chip, said second output interface comprising
      a second output request connection for receiving a second output request signal asserted by said fourth core,
      a second output ready connection for asserting a second output ready signal to said fourth core, and
      a second output data connection connected to said data processing logic, for transmitting said second output token to said fourth core; and
   c) said first core further comprises second output control logic connected to said second output interface, for controlling said first core to transmit said second output token to said fourth core if said second output request signal and said second output ready signal are asserted synchronously.

5. The system of claim 1 wherein:
   a) said first output interface is further connected to a fourth core integrated on said chip, said first output interface further comprising
      a second output request connection for receiving a second output request signal asserted by said fourth core, a second output ready connection for asserting a second output ready signal to said fourth core; and b) said first output control logic comprises logic for controlling said first core to transmit said first output token to said fourth core if said second output request signal and said second output ready signal are asserted synchronously.

6. The system of claim 1 wherein:

a) said first core further comprises a second input interface connected to said data processing logic and to a fourth core integrated on said chip, said second input interface comprising
   a second input ready connection for receiving a second input ready signal asserted by said fourth core,
   a second input request connection for asserting a second input request signal to said fourth core, and
   a second input data connection connected to said data processing logic, for receiving a second input token from said fourth core;

b) said first core further comprises second input control logic connected to said second input interface, for controlling said first core to receive said second input token from said fourth core if said second input request signal and said second input ready signal are asserted synchronously; and c) said data processing logic comprises logic for generating said first output token from said first input token and said second input token.

7. The system of claim 1 wherein said first core comprises a plurality of pipestages including an input interface pipestage comprising at least two register levels for simultaneously holding at least two tokens.

8. The system of claim 1 wherein said first core comprises a plurality of pipestages including an output interface pipestage comprising at least two register levels for simultaneously holding at least two tokens.

9. The system of claim 1 wherein said first core further comprises a random access memory interface connected to said data processing logic and to a random access memory integrated on said chip.

10. A data processing system comprising a first data-driven core and a second data-driven core integrated on a chip, said first core comprising:

a) a first input interface connected to said second core, comprising
   a first input request connection for asserting a first input request signal to said second core,
   a first input ready connection for receiving a first input ready signal asserted by said second core, and
   a first input data connection for receiving a first input token from said second core;

b) data processing logic connected to said first input data connection, for generating a first output token from said first input token; and c) first control logic connected to said first input interface and responsive to said first input ready signal, for controlling said first core to receive said first input token from said second core synchronously with said first input ready signal and said input request signal.

11. The system of claim 10 wherein:

a) said first core further comprises a second input interface connected to said data processing logic and to a third core integrated on said chip, said second input interface comprising
   a second input ready connection for receiving a second input ready signal asserted by said third core,
   a second input request connection for asserting a second input request signal to said third core, and
   a second input data connection connected to said data processing logic, for receiving a second input token from said third core;

b) said first core further comprises second control logic connected to said second input interface and responsive to said second input ready signal, for controlling said first core to receive said second input token from said third core synchronously with said second input request signal and said second input ready signal; and c) said data processing logic comprises logic for generating said first output token from said first input token and said second input token.

12. The system of claim 10 wherein said first core comprises a plurality of pipestages including an input interface pipestage comprising at least two register levels for simultaneously holding at least two tokens.

13. A data processing system comprising a first data-driven core and a second data-driven core integrated on a chip, said first core comprising:

a) a first output interface connected to said second core, comprising
   a first output ready connection for asserting a first output ready signal to said second core,
   a first output request connection for receiving a first output request signal asserted by said second core, and
   a first output data connection for sending a first output token to said second core;

b) data processing logic connected to said first output data connection, for generating said first output token from a first input token; and c) first control logic connected to said first output interface and responsive to said first output request signal, for controlling said first core to transmit said first output token to said second core synchronously with said first output request signal and said first output ready signal.

14. The system of claim 13 wherein:

a) said data processing logic comprises logic for generating a second output token from said first input token;

b) said first core further comprises a second output interface connected to said data processing logic and to a third core integrated on said chip, said second output interface comprising
   a second output request connection for receiving a second output request signal asserted by said third core,
   a second output ready connection for asserting a second output ready signal to said third core, and
   a second output data connection connected to said data processing logic, for transmitting said second output token to said third core; and c) said first core further comprises second control logic connected to said second output interface, for controlling said first core to transmit said second output token to said third core synchronously with said second output request signal and said second output ready signal.

15. The system of claim 13 wherein:

a) said first output interface is further connected to a third core integrated on said chip, said first output interface further comprising
   a second output request connection for receiving a second output request signal asserted by said third core, a second output ready connection for asserting a second output ready signal to said third core; and b) said first control logic comprises logic for controlling said first core to transmit said first output token to said third core synchronously with said second output request signal and said second output ready signal.

16. The system of claim 13 wherein said first core comprises a plurality of pipestages including an output interface pipestage comprising at least two register levels for simultaneously holding at least two tokens.

17. A data processing device comprising a plurality of interconnected data-driven cores integrated on a chip, each of said plurality of cores comprising a plurality of interconnected pipestages, each of said plurality of pipestages comprising:

a) a data path having an input data connection for receiving a first input token, an output data connection for transmitting a first output token derived from said first input token, and a set of token registers situated in said data path between said input data connection and said output data connection, for storing data derived from said first input token;

b) a control path having
a control register for holding a control tag indicative of a storage capability and a transmission capability of said set of token registers; and
control logic connected to an output of said control register, said control logic having
an external input ready connection for receiving an input ready signal,
an external input request connection for asserting an input request signal if said control tag indicates that said each of said pipestages is capable of receiving said first input token,
an external output ready connection for asserting an output ready signal if said control tag indicates that said each of said pipestages is capable of transmitting said output token, and
an external output request connection for receiving an output request signal; wherein
said control logic is connected to said set of token registers, for controlling said each of said pipestages to receive said first input token if said input ready signal and said input request signal are asserted synchronously, and to transmit said output token if said output ready signal and said output request signal are asserted synchronously; and
said control logic is further connected to an input of said control register for updating said control tag when said each of said pipestages receives said first input token and when said each of said pipestages transmits said first output token.

18. The system of claim 17 wherein said control logic comprises logic for controlling said each of said pipestages to receive said first input token synchronously with said input ready signal and said input request signal, and to transmit said first output token synchronously with said output ready signal and said output request signal.

19. The system of claim 17 wherein said data path further comprises combinational data processing logic connected to said set of token registers, for processing said first input token to generate said first output token.

20. The system of claim 17 wherein said plurality of pipestages comprises an input pipestage, said set of token registers of said input pipestage comprising a first token register R0 for storing a token derived from said first input token, and a second token register R1 for storing a token derived from a second input token received over said input data connection.

21. The system of claim 20 wherein:
an input of said second token register R1 is connected to an output of said first token register R0,
an output of said second token register R1 and said output of said first token register R0 are connected to respective inputs of a multiplexer, and
an output of said multiplexer is connected to said output data connection.

22. The system of claim 17 wherein said plurality of pipestages comprises an output pipestage, said set of token registers of said output pipestage comprising a first token register R0 for storing a token derived from said first input token, and a second token register R1 for storing a token derived from a second input token received over said input data connection.

23. The system of claim 22 wherein:
an output of said first token register R0 is connected to said output data connection,
an input of said first token register R0 is connected to an output of a multiplexer, and
an input and an output of said second token register R1 are connected to respective inputs of said multiplexer.

24. The system of claim 22 wherein said output data connection is in communication with at least two of said plurality of cores.

25. The system of claim 23 wherein said control logic further comprises a DONE register for holding a DONE tag indicative of which of said at least two of said plurality of cores have received said first output token.

26. The system of claim 17 wherein said plurality of pipestages comprises an internal pipestage, said control logic of said internal pipestage comprising:

a) input control interface logic having
a plurality of external input ready connections for receiving a plurality of input ready signals IRDY(j), j=0 . . . K−1, K>0,
a plurality of internal input request connections for receiving a corresponding plurality of input request signals IREQX(j),
a plurality of external input request connections for asserting said plurality of input request signals IREQ (j), and
an internal input ready connection for asserting an input ready signal IRDYX derived from said plurality of input ready signals IRDY(j) from and said plurality of input request signals IREQX(j);

b) internal control logic connected to said control register, said set of token registers, said plurality of internal input request connections, and said internal input ready connection, for asserting said input request signals IREQX(j) and for controlling said internal pipestage to receive said first input token if said input ready signal IRDYX and an input request signal IREQ(j) corresponding to said first input token are asserted synchronously.

27. The system of claim 26 wherein said input interface logic comprises logic for generating said input ready signal IRDYX according to a relation IRDYX=&(!IREQX(j)|IRDY(j)), j=0 . . . K−1.

28. The system of claim 17 wherein said plurality of pipestages comprises an internal pipestage, said control logic of said internal pipestage comprising:

a) output control interface logic having
a plurality of external output request connections for receiving a plurality of output request signals OREQ (j), j=0 . . . K−1, K>0, an internal output ready connection for receiving an output ready signal ORDYX, a plurality of external output ready connections for asserting a plurality of output ready signals ORDY(j) derived from said output ready signal ORDYX and said plurality of input request signals OREQ(j), and an internal output request connection for asserting an output request signal OREQX derived from said plurality of output request signals OREQ(j);

b) internal control logic connected to said control register, said set of token registers, said internal output request connection, and said internal input output connection, for asserting said output ready signal ORDYX if said control tag indicates that said internal pipestage is capable of transmitting said first output token, and for controlling said internal pipestage to transmit said first output token if said output request signal OREQX and said output ready signal ORDYX are asserted synchronously.

29. The system of claim 28 wherein said output interface logic comprises logic for generating said output request signal OREQX according to a relation OREQX=&OREQ(j), j=0 . . . K−1, and for generating said plurality of output ready signals ORDY(j) according to a relation selected from $$ORDY(j)=ORDYX\&(\&OREQ(j')), j'=(0 \ldots j-1, j+1 \ldots K-1)$$

and $$ORDY(j)=ORDYX\&\cdot(\&OREQ(j')), j'=(0 \ldots K-1).$$

30. A method of generating an output token comprising:
a) providing a first data-driven core, a second data-driven core connected to an input of said first core, and a third data-driven core connected to an output of said first core, wherein said first core, second core, and third core are integrated on a chip;
b) asserting a first input request signal from said first core to said second core over a first input request connection;
c) asserting a first input ready signal from said second core to said first core over a first input ready connection,
d) transmitting a first input token from said second core to said first core if said first input request signal and said first input ready signal are asserted synchronously;
e) generating a first output token from said first input token;
f) asserting a first output request signal from said third core to said first core over a first output request connection;
g) asserting a first output ready signal from said first core to said third core over a first output ready connection; and
h) transmitting said first output token from said first core to said third core if said first output request signal and said first output ready signal are asserted synchronously.

31. A data processing system comprising a first data-driven core, a second data-driven core, and a third data-driven core integrated on a chip, said first core comprising:
a) means for asserting a first input request signal from said first core to said second core over a first input request connection;
b) means for asserting a first input ready signal from said second core to said first core over a first input ready connection,
c) means for transmitting a first input token from said second core to said first core if said first input request signal and said first input ready signal are asserted synchronously;
d) means for generating a first output token from said first input token;
e) means for asserting a first output request signal from said third core to said first core over a first output request connection;
f) means asserting a first output ready signal from said first core to said third core over a first output ready connection; and
g) means for transmitting said first output token from said first core to said third core if said first output request signal and said first output ready signal are asserted synchronously.

32. A data processing system comprising a first data-driven core, a second data-driven core, and a third data-driven core integrated on a chip, said first core comprising:
an input interface connected to said second core, comprising
an input request connection for asserting an input request signal to said second core,
an input ready connection for receiving an input ready signal asserted by said second core, and
an input data connection for receiving an input token from said second core if said input request signal and said input ready signal are asserted synchronously;
processing logic connected to said input data connection, for generating an output token from said input token; and
an output interface connected to said processing logic and said third core, comprising
an output request connection for receiving an output request signal asserted by said third core,
an output ready connection for asserting an output ready signal to said third core, and
an output data connection connected to said processing logic, for transmitting said output token to said third core if said output request signal and said output ready signal are asserted synchronously.

33. A method of designing a data processing system, comprising:
a) providing a plurality of core representations encoding a corresponding plurality of data-driven cores, each of said plurality of cores comprising
an input request connection for asserting an input request signal;
an input ready connection for receiving an input ready signal;
a first input data connection for receiving an input token;
input interface control logic connected to said input request connection, said input ready connection, and said input data connection, for controlling said each of said plurality of cores to receive said input token if said input request signal and said input ready signal are asserted synchronously;
data processing logic connected to said input data connection, for generating an output token from said input token;
an output request connection for receiving an output request signal;
an output ready connection for asserting an output ready signal;
an output data connection connected to said data processing logic, for transmitting said output token; and output interface control logic connected to said output request connection, said output ready connection, and said output data connection, for controlling said each of said plurality of cores to transmit said output token if said output request signal and said output ready signal are asserted synchronously;

b) interconnecting said core representations to generate a representation of said system; and c) implementing said representation of said system on a single chip.

* * * * *